United States Patent
Ha Woo et al.

(10) Patent No.: US 9,173,298 B2
(45) Date of Patent: Oct. 27, 2015

(54) PACKAGING SUBSTRATE, METHOD FOR MANUFACTURING SAME, AND CHIP PACKAGING STRUCTURE HAVING SAME

(71) Applicant: Zhen Ding Technology Co., Ltd., Tayuan, Taoyuan (TW)

(72) Inventors: Yong Ha Woo, Kwang myung (KR); E-Tung Chou, Taoyuan (TW); Wen-Lun Lo, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 70 days.

(21) Appl. No.: 14/097,251

(22) Filed: Dec. 5, 2013

(65) Prior Publication Data
US 2014/0185259 A1    Jul. 3, 2014

(30) Foreign Application Priority Data
Dec. 28, 2012   (CN) .......................... 2012 1 05822446

(51) Int. Cl.
| H01L 21/48 | (2006.01) |
| H01L 21/44 | (2006.01) |
| H05K 3/00 | (2006.01) |
| H01L 23/498 | (2006.01) |
| H01L 25/10 | (2006.01) |
| H05K 3/34 | (2006.01) |
| H05K 3/40 | (2006.01) |

(52) U.S. Cl.
CPC .......... *H05K 3/0017* (2013.01); *H01L 21/4853* (2013.01); *H01L 23/49811* (2013.01); *H01L 23/49816* (2013.01); *H01L 23/49827* (2013.01); *H01L 25/105* (2013.01); *H01L 2224/16225* (2013.01); *H01L 2224/32145* (2013.01); *H01L 2224/32225* (2013.01); *H01L 2224/48091* (2013.01); *H01L 2224/73204* (2013.01); *H01L 2224/73265* (2013.01); *H01L 2225/1023* (2013.01); *H01L 2225/1058* (2013.01); *H01L 2924/15311* (2013.01); *H05K 3/3436* (2013.01); *H05K 3/4007* (2013.01); *H05K 2201/0347* (2013.01); *H05K 2201/0379* (2013.01); *H05K 2201/09836* (2013.01); *H05K 2201/10674* (2013.01); *H05K 2203/0384* (2013.01)

(58) Field of Classification Search
CPC ................... H01L 21/76898; H01L 21/76877; H01L 23/5226
USPC ........................... 438/106–107; 257/678, 686
See application file for complete search history.

(56) References Cited

U.S. PATENT DOCUMENTS

| 6,916,685 B2 * | 7/2005 | Yang et al. ..................... 438/108 |
| 7,799,608 B2 * | 9/2010 | Chan et al. ..................... 438/108 |

* cited by examiner

*Primary Examiner* — Theresa T. Doan
(74) *Attorney, Agent, or Firm* — Novak Druce Connolly Bove + Quigg LLP

(57) ABSTRACT

A packaging substrate includes a circuit board, a number of first conductive posts, and a number of second conductive posts. The circuit board includes a first base and a first conductive pattern layer formed on a first surface of the first base. The first conductive posts extend from and are electrically connected to the first conductive pattern layer. The second conductive posts extend from and are electrically connected to the first conductive pattern layer. The height of each of the second conductive posts are larger than that of each of the first conductive posts.

5 Claims, 17 Drawing Sheets

PACKAGING SUBSTRATE, METHOD FOR MANUFACTURING SAME, AND CHIP PACKAGING STRUCTURE HAVING SAME

BACKGROUND

1. Technical Field

The present disclosure relates to semiconductor packaging technology and, particularly, to a packaging substrate, a method for manufacturing the packaging substrate, and a chip packaging structure having the packaging substrate.

2. Description of Related Art

A chip packaging structure includes a packaging substrate, a connecting substrate, and a number of chips. Some of the chips are arranged on and are electrically connected to the packaging substrate, and the other chips are arranged on and are electrically connected to the connecting substrate. The packaging substrate is mechanically and electrically connected to the connecting substrate through a number of solder balls, which are formed between one surface of the packaging substrate and an opposing surface of the connecting surface. However, the binding force between the packaging substrate and the connecting surface is limited because the contact areas between the solder balls and the surfaces are limited. Thus, the solder balls are easily damaged if the chip packaging structure is touched when in transport or in use. This will make the chip packaging structure not work normally and safe.

Therefore, it is desirable to provide a packaging substrate, a method for manufacturing the packaging substrate, and a chip packaging structure having the packaging substrate, to overcome or at least alleviate the above-mentioned problems.

DETAILED DESCRIPTION

Referring to FIGS. 1-11, a method for manufacturing a packaging substrate 100a, according to a first exemplary embodiment, is shown. The method includes the following steps.

Figure 1:
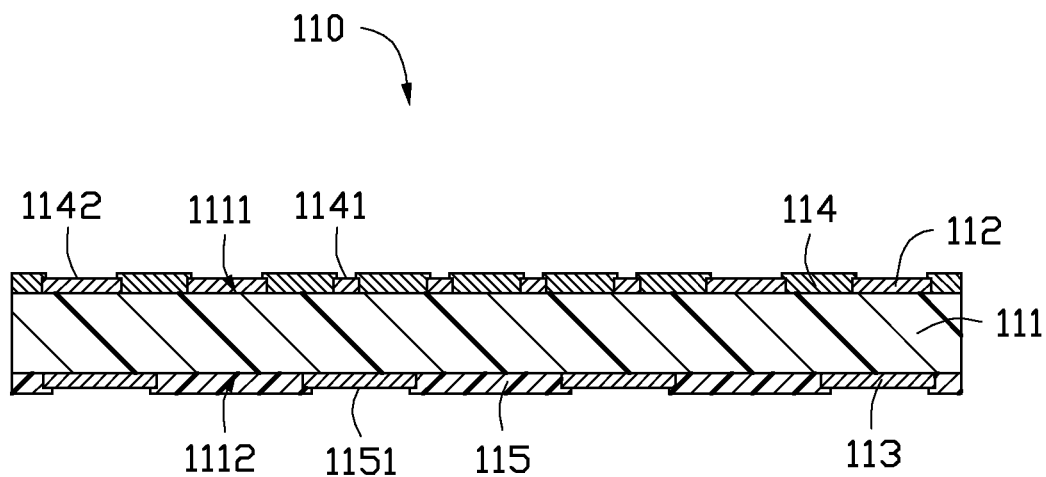
FIGS. 1-11 show steps of a method for manufacturing a packaging substrate, according to a first exemplary embodiment.

First, referring to FIG. 1, a circuit board 110 is provided.

The circuit board 110 may be a single-sided circuit board, a double-sided circuit board, or a multilayer circuit board. The circuit board 110 includes a first base 111, a first conductive pattern layer 112, a second conductive pattern layer 113, a first solder mask 114, and a second solder mask 115. In this embodiment, the circuit board 110 is a multilayer circuit board, and includes a number of resin layers (not shown) and a number of conductive pattern layers (not shown) alternatively stacked on one another.

The first base 111 includes a first surface 1111 and a second surface 1112. The first surface 1111 and the second surface 1112 are positioned at opposite sides of the first base 111, and the first surface 1111 is substantially parallel to the second surface 1112. The first conductive pattern layer 112 is located on the first surface 1111. The second conductive pattern layer 113 is located on the second surface 1112. The first conductive pattern layer 112 is electrically connected to the second conductive pattern layer 113 through via holes (not shown) defined in the first base 111.

The first solder mask 114 covers part of the first surface 1111 which is exposed to the first conductive pattern layer 112 and part of the first conductive pattern layer 112. The first solder mask 114 defines a number of first openings 1141 and a number of second openings 1142. The first openings 1141 are positioned at a central portion of the first solder mask 114 and are arranged in an array. The second openings 1142 surround the first openings 1141. The cross-sectional area of each of the first openings 1141 is less than that of each of the second openings 1142. The first conductive pattern layer 112 is exposed to the first openings 1141 and the second openings 1142.

The second solder mask 115 covers part of the second surface 1112 which is exposed to the second conductive pattern layer 113 and part of the second conductive pattern layer 113. The second solder mask 115 defines a number of third openings 1151. The second conductive pattern layer 113 is exposed to the third openings 1151.

Figure 2:
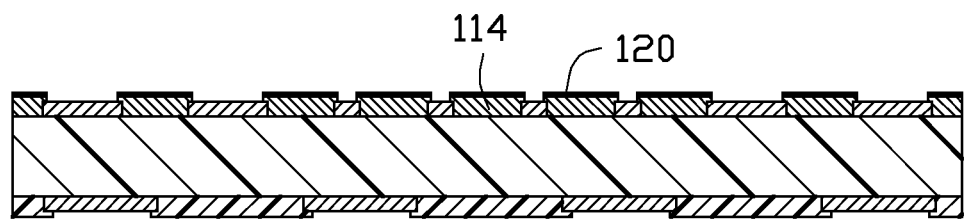

Second, referring to FIG. 2, a metal layer 120 is formed on the first solder mask 114. The metal layer 120 is a copper layer and serves as a seed layer. In this embodiment, the metal layer 120 is formed by a sputtering coating process.

Figure 3:
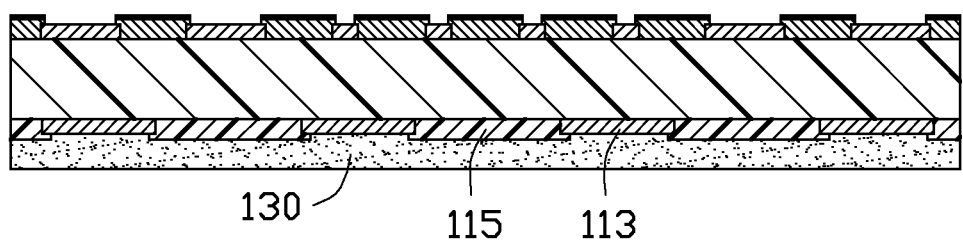

Third, referring to FIG. 3, a first plating barrier pattern 130 is formed on the second solder mask 115 and on part of the second conductive pattern layer 113 which is exposed to the second solder mask 115. In this embodiment, the first plating barrier pattern 130 is formed by a printing stripping rubber method.

Figure 4:
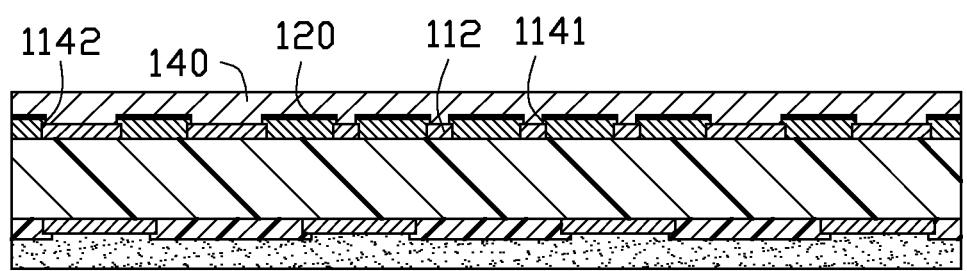

Fourth, referring to FIG. 4, a first plating layer 140 is formed on the metal layer 120 and the first conductive pattern layer 112. In detail, the first plating layer 140 covers the entire metal layer 120 and the part of the first conductive pattern layer 112 which is exposed to the first openings 1141 and the second openings 1142. In this embodiment, the first plating layer 140 is made of copper.

Figure 5:
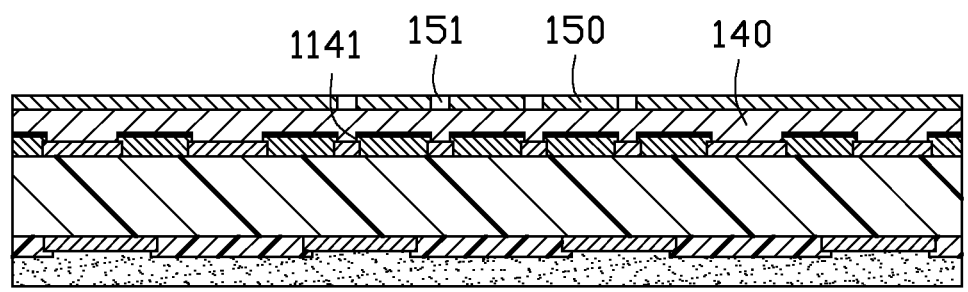

Fifth, referring to FIG. 5, a second plating barrier pattern 150 is formed on the first plating layer 140. The second plating barrier pattern 150 defines a number of first through holes 151 corresponding to the respective first openings 1141. The first through holes 151 are arranged in an array and correspond to pads of a to-be-packaged chip (not shown). The first through holes 151 may be formed by laser beams.

Figure 6:
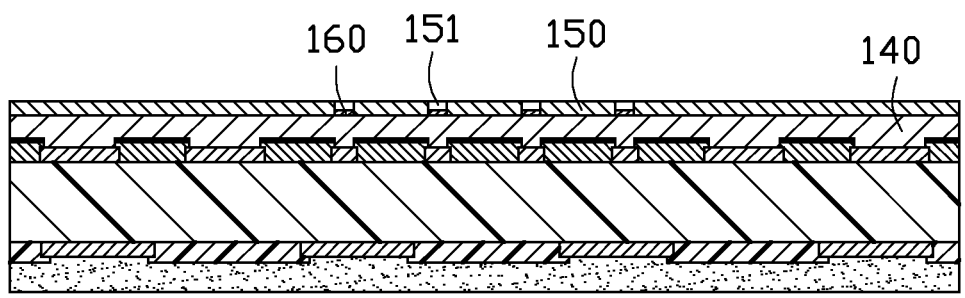

Sixth, referring to FIG. 6, a first etching barrier pattern 160 is formed on part of the first plating layer 140 which is exposed to the first through holes 151 by a plating method. The first etching barrier pattern 160 corresponds to the first through holes 151. In this embodiment, the first etching barrier pattern 160 may be made of tin or nickel. That is, the first etching barrier pattern 160 does not react with an etching agent which can etch the copper away. Thus, the part of the first plating layer 140 covered by the first etching barrier pattern 160 can be maintained when the first plating layer 140 is etched in the etching agent. The first etching barrier pattern 160 may be made of the other metal which does not react with the etching agent.

Figure 7:
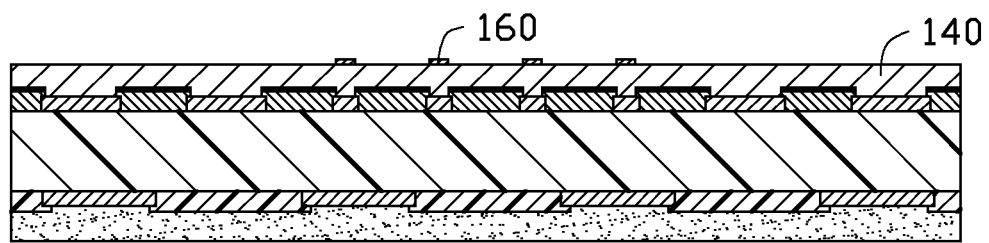

Seventh, referring to FIGS. 6-7, the second plating barrier pattern 150 is removed by stripping.

Figure 8:
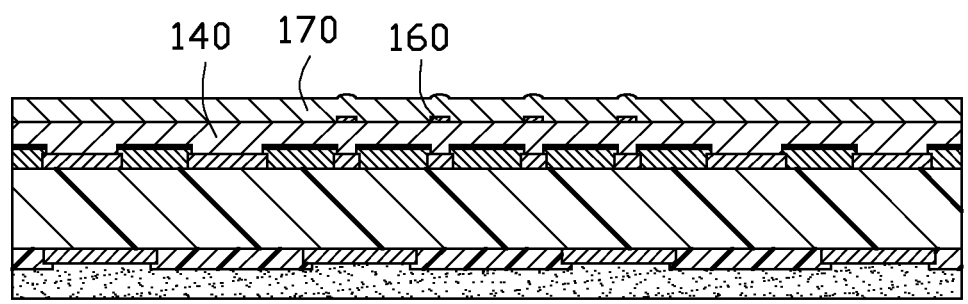

Eighth, referring to FIG. 8, a second plating layer 170 is formed on the first plating layer 140 and the first etching barrier pattern 160 by plating. In this embodiment, the second plating layer 170 is made of copper. The thickness of the second plating layer 170 is larger than that of the first etching barrier pattern 160. That is, the first etching barrier pattern 160 is entirely packaged in the second plating layer 170.

Figure 9:
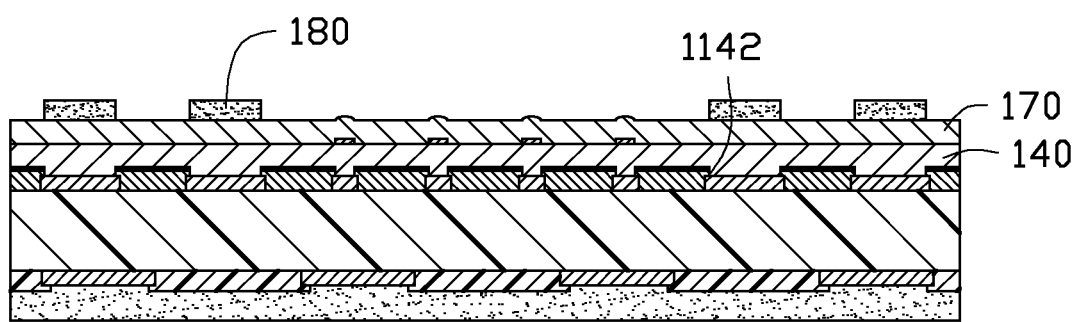

Ninth, referring to FIG. 9, a second etching barrier pattern 180 corresponding to the second openings 1142 is formed on the second plating layer 170. In detail, a dry film is first attached on the second plating layer 170, and then is exposed and developed; thereby the second etching barrier pattern 180 is formed.

Figure 10:
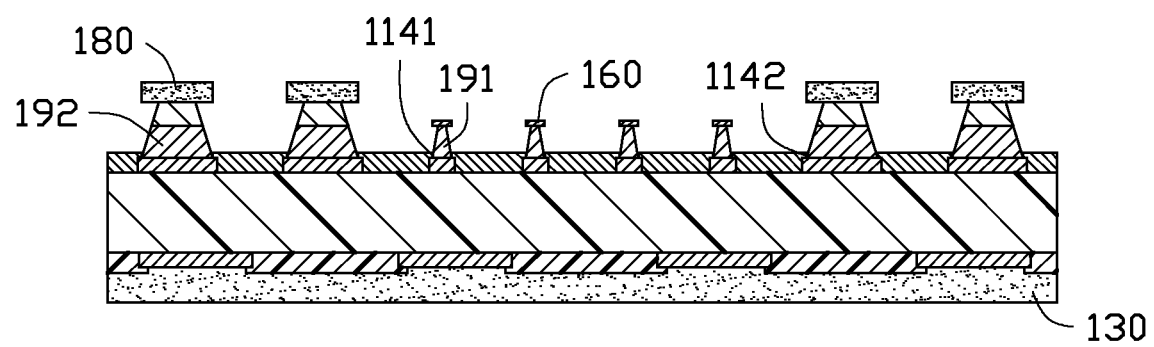

Tenth, referring to FIG. 10, the first plating layer 140 and the second plating layer 170 are etched to form a number of first conductive posts 191 and a number of second conductive posts 192 using an etching agent. The first conductive post 191 includes part of the first plating layer 140, which is shielded by the first etching barrier pattern 160. The second conductive post 192 includes part of the first plating layer 140 and part of the second plating layer 170, which are shielded by the second etching barrier pattern 180. In this embodiment, the etching factor is greater than four, for reducing lateral erosion. The first conductive posts 191 are located in the respective first openings 1141, and the second conductive posts 192 are located in the respective second openings 1142. The height of each of the first conductive posts 191 is equal to the thickness of the first plating layer 140. The height of each of the second conductive posts 192 is equal to the sum of the thickness of the first plating layer 140 and the thickness of the second plating layer 170.

Figure 11:
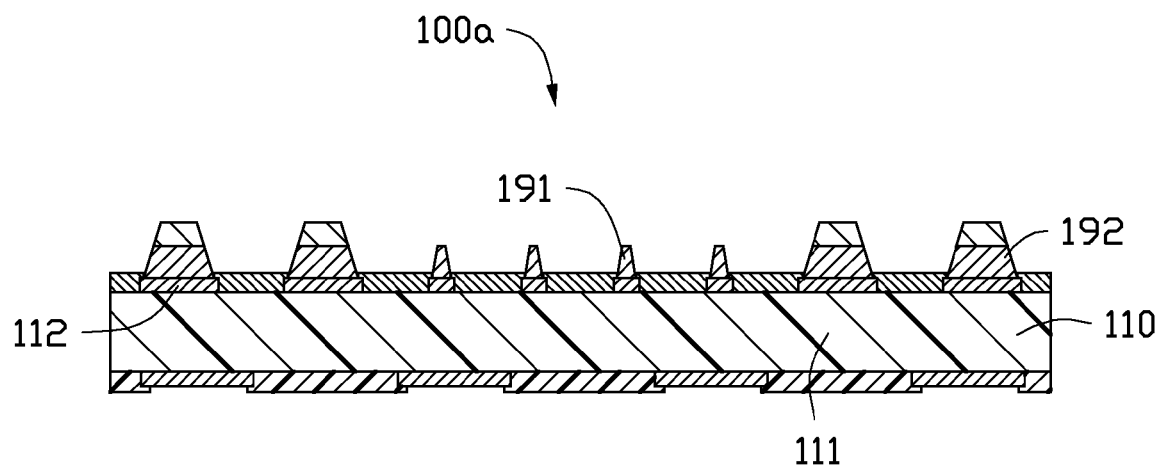

Eleventh, referring to FIGS. 10-11 the first plating barrier pattern 130, the first etching barrier pattern 160, and the second etching barrier pattern 180 are removed to form the packaging substrate 100a. In other embodiments, referring to FIG. 10 together with FIG. 12, the first etching barrier pattern 160 can be maintained. Instead, the first etching barrier pattern 160 is molten to form solder caps 193 using an IR-reflow soldering process. The solder caps 193 are configured to protect part of the first conductive pattern layer 112 corresponding to the solder caps 193.

Referring to FIGS. 1-8 and 13-15, a method for manufacturing a packaging substrate 100b, according to a second exemplary embodiment, is shown. The first step to the eighth step in this embodiment is the same as the first step to the eighth step in the first embodiment. Thus, the explanations for the method of the second embodiment begin with the ninth step as the following.

Figure 13:
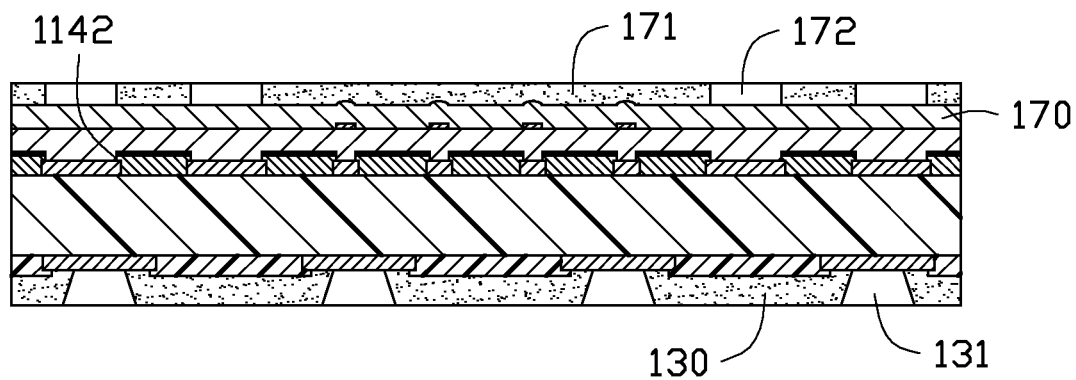
FIGS. 13-15 show steps of a method for manufacturing a packaging substrate, according to a second exemplary embodiment.

Ninth, referring to FIG. 13, a photoresist layer 171 with a number of second through holes 172 is formed on the second plating layer 170 and a number of third through holes 131 are defined in the first plating barrier pattern 130. In detail, the second through holes 172 correspond to the second openings 1142.

Figure 14:
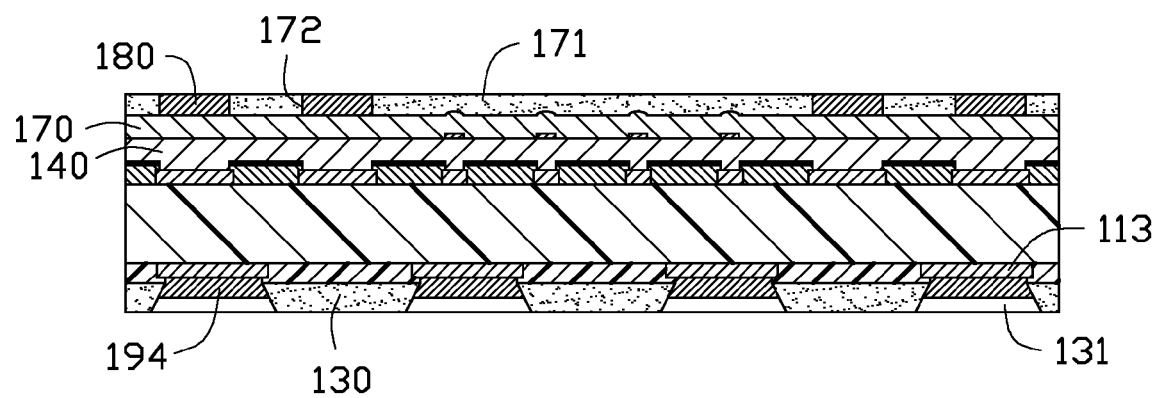

Tenth, referring to FIG. 14, a second etching barrier pattern 180 is formed on the part of the second plating layer 170 exposed to the second through holes 172 and a protective layer 194 is formed on the part of the second conductive pattern layer 113 that is exposed to the third through holes 131. In this embodiment, the second etching barrier pattern 180 and the protective layer 194 are gold plating over nickel and are formed using by plating. That is, the second etching barrier pattern 180 severs as a protective layer.

Figure 15:
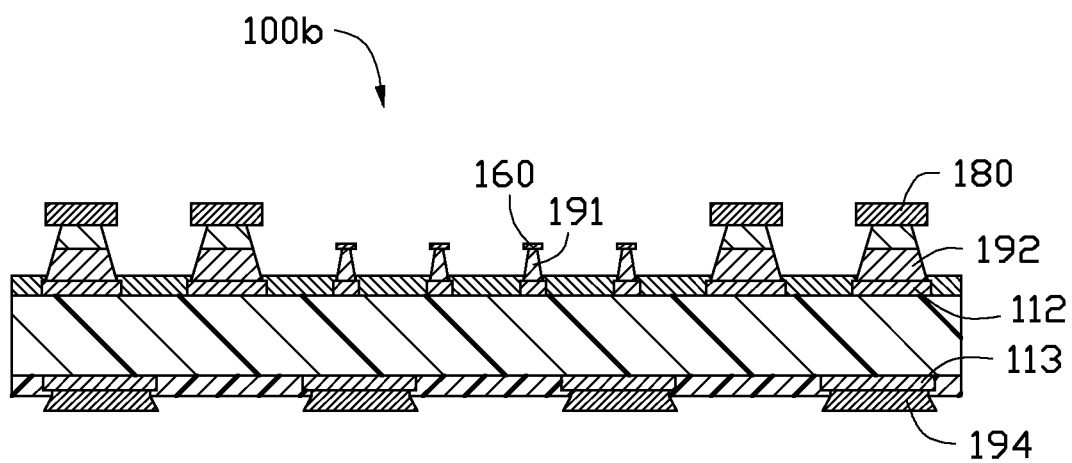
Figure 16:
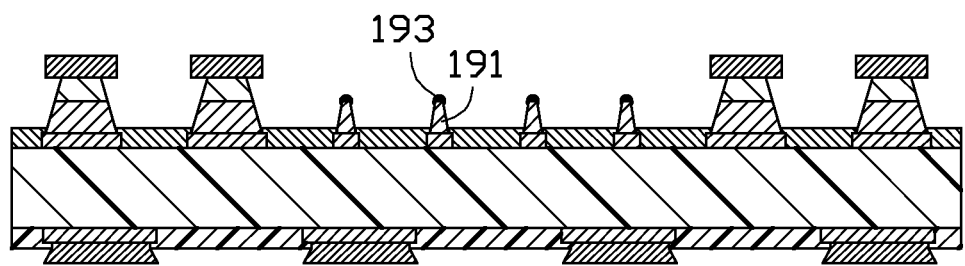
FIG. 16 is similar to FIG. 12, but showing an alternative embodiment of the packaging substrate.

Eleventh, referring to FIGS. 14-15, the photoresist layer 171 and the first plating barrier pattern 130 are removed, the first plating layer 140 and the second plating layer 170 are etched to form a number of first conductive posts 191 and a number of second conductive posts 192, thereby the packaging substrate 100b is formed. The first etching barrier pattern 160 is located on a top end of each of the first conductive posts 191, and the second etching barrier pattern 180 is positioned on a top end of each of the second conductive posts 192. Therefore, the first etching barrier pattern 160 cooperate with the second etching barrier pattern 180 to protect the first conductive pattern layer 112. The protective layer 194 is configured to protect the second conductive pattern layer 113. In other embodiments, referring to FIG. 16 together with FIG. 15, the first etching barrier pattern 160 can be molten to form solder caps 193 using an IR-reflow soldering process.

Figure 12:
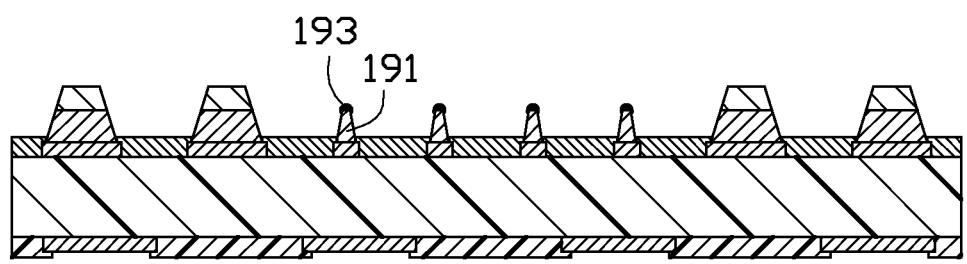
FIG. 12 is a schematic view of an alternative embodiment of the packaging substrate.

Referring to FIG. 12, a packaging substrate 100a, according to a third exemplary embodiment, is shown. The packaging substrate 100a includes a circuit board 110, a number of first conductive posts 191, and a number of second conductive posts 192.

The circuit board 110 may be a single-sided circuit board, a double-sided circuit board, or a multilayer circuit board. The circuit board 110 includes a first base 111, a first conductive pattern layer 112, a second conductive pattern layer 113, a first solder mask 114, and a second solder mask 115. In this embodiment, the circuit board 110 is a multilayer circuit board, and includes a number of resin layers (not shown) and a number of conductive pattern layers (not shown) alternatively stacked on one another.

The first base 111 includes a first surface 1111 and a second surface 1112. The first surface 1111 and the second surface 1112 are positioned at opposite sides of the first base 111, and the first surface 1111 is substantially parallel to the second surface 1112. The first conductive pattern layer 112 is located on the first surface 1111. The second conductive pattern layer 113 is located on the second surface 1112. The first conductive pattern layer 112 is electrically connected to the second conductive pattern layer 113 through via holes (not shown) defined in the first base 111.

The first solder mask 114 covers part of the first surface 1111 which is exposed to the first conductive pattern layer 112 and part of the first conductive pattern layer 112. The first solder mask 114 defines a number of first openings 1141 and a number of second openings 1142. The first openings 1141 are positioned at a central portion of the first solder mask 114 and are arranged in an array. The second openings 1142 surround the first openings 1141. The cross-sectional area of each of the first openings 1141 is less than that of each of the second openings 1142. The first conductive pattern layer 112 is exposed to the first openings 1141 and the second openings 1142.

The second solder mask 115 covers part of the second surface 1112 which is exposed to the second conductive pattern layer 113 and part of the second conductive pattern layer 113. The second solder mask 115 defines a number of third openings 1151. The second conductive pattern layer 113 is exposed to the third openings 1151.

The first conductive posts 191 correspond to the first openings 1141. The second conductive posts 192 correspond to the second openings 1142. The first conductive posts 191 extend from the first conductive pattern layer 112 in the respective first openings 1141. The second conductive posts 192 extend from the first conductive patter layer 112 in the respective second openings 1142. The height of each of the second conductive posts 192 is larger than that of each of the first conductive posts 191. A solder cap 193 is formed on a top end of each of the first conductive posts 191. The solder cap 193 is made of tin or nickel. In other embodiments, a protective layer (not shown) can be formed on a top end of each of the second conductive posts 192, and the protective layer is gold plating over nickel.

Figure 17:
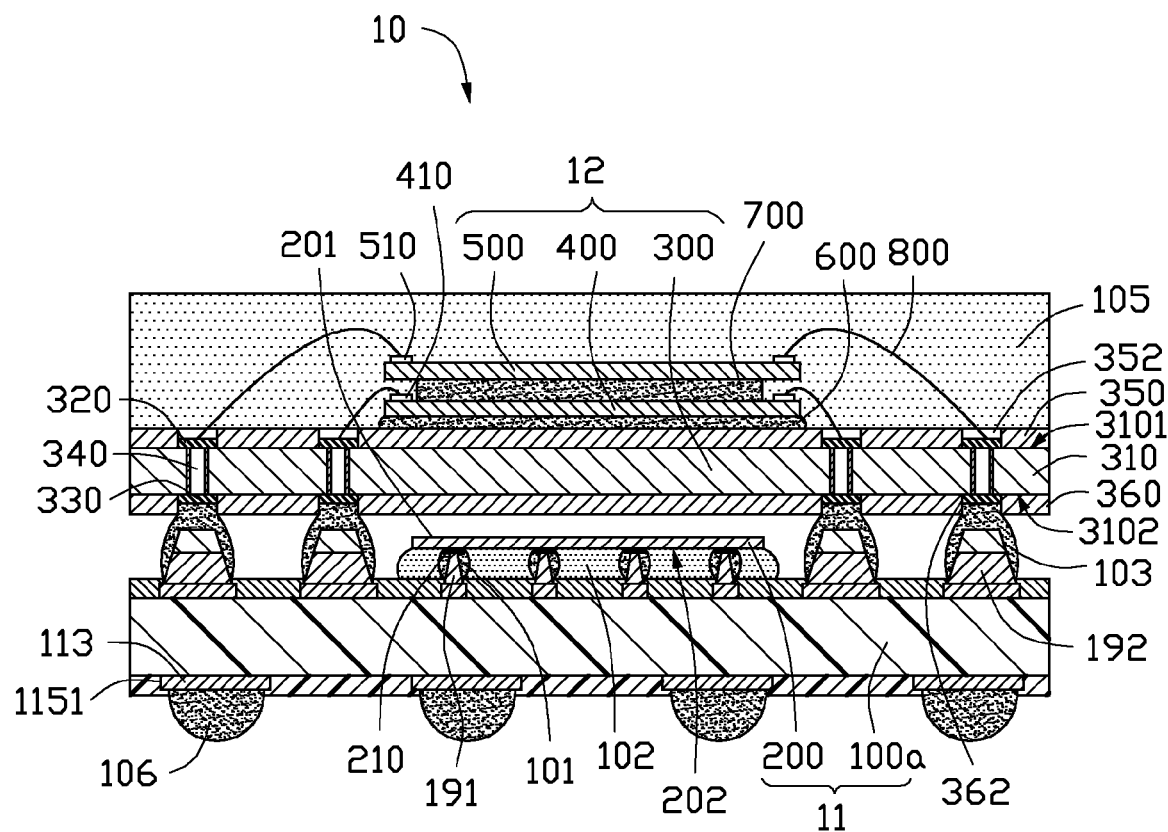
FIG. 17 is a cross-sectional view of a chip packaging structure, according to a third exemplary embodiment.

Referring to FIG. 17, a chip packaging structure 10, according to a fourth exemplary embodiment, is shown. The chip packaging structure 10 includes a first chip packaging body 11 and a second chip packaging body 12.

The first chip packaging body 11 includes the packaging substrate 100a of the first embodiment and a first chip 200. The first chip 200 includes a first top surface 201 and a first bottom surface 202. The first top surface 201 and the first bottom surface 202 are positioned at opposite sides of the first chip 200. The first top surface 201 is substantially parallel to the first bottom surface 202. A number of first electrode pads 210 are arranged on the first bottom surface 202 and correspond to the first conductive posts 191. The first chip 200 is supported on the first conductive posts 191. In detail, each of the first electrode pads 210 contacts the corresponding first conductive post 191, and a first solder ball 101 surrounds the entire circumferential surface of the first conductive post 191 and the corresponding first electrode pad 210. Thus, the first chip 200 is mechanically and electrically connected to the packaging substrate 100a. A first packaging glue 102 is filled in a gap between the first chip 200 and the packaging substrate 100a, therefore the connection between the first chip 200 and the packaging substrate 100a is more reliable.

The second chip packaging body 12 includes a connecting substrate 300, a second chip 400, and a third chip 500. The connecting substrate 300 includes a second base 310, a number of first contact pads 320, a number of second contact pads 330, a third solder mask 340, and a fourth solder mask 350.

The second base 310 includes a second top surface 3101 and a second bottom surface 3102. The second top surface 3101 and the second bottom surface 3102 are positioned at opposite sides of the second base 310, and the second top surface 3101 is substantially parallel to the second bottom surface 3102. The second base 310 defines a number of conductive holes 340 corresponding to the second conductive posts 192, the first contact pads 320, and the second contact pads 330. Each of the conductive holes 340 passes through the second top surface 3101 and the second bottom surface 3102.

The first contact pads 320 are formed on the second top surface 3101 and are aligned with the respective conductive holes 340. The second contact pads 330 are formed on the second bottom surface 3102 and are aligned with the respective conductive holes 340. That is, the first contact pads 320 are electrically connected to the respective second contact pads 330 through the respective conductive holes 340.

The third solder mask 350 is formed on the second top surface 3101 and defines a number of fourth opening 352 corresponding to the first contact pads 320. Each of the first contact pads 320 is exposed to the corresponding fourth opening 352. The fourth solder mask 360 is formed on the second bottom surface 3102 and defines a number of fifth openings 362 corresponding to the second contact pads 330. Each of the second contact pads 330 is exposed to the corresponding fifth opening 362.

The second chip 400 is located on the third solder mask 350 through a second packaging glue 600. The third chip 500 is located on the second chip 400 through a dielectric film 700 and is spaced apart from the second chip 400. A number of second electrode pads 410 are formed on the second chip 400 surrounding the second packaging glue 600. A number of third electrode pads 510 are formed on the third chip 500 surrounding the dielectric film 700. The second electrode pads 410 and the third electrode pads 510 are electrically connected to the first contact pads 320 through wires 800. A third packaging glue 105 is formed on the connecting substrate 300 and seals the entire second chip 400, the entire third chip 500, the entire second solder mask 350, and the entire wires 800, therefore the connection between the second chip 400, the third chip 500 and the connecting substrate 300 is more reliable.

When the second chip packaging body 12 is packaged on the first chip packaging body 11, the second conductive posts 192 are mechanically and electrically connected to the respective second contact pads 330 through second solder balls 103. In detail, each of the second solder balls 103 surrounds the entire circumferential surface of the corresponding second conductive post 192 and covers the entire corresponding second contact pad 330. In this embodiment, a number of third solder balls 106 are formed on the second conductive pattern layer 113 exposed to the respective third openings 1151. The third solder balls 106 are configured for connecting the other electronic elements (not shown). In this embodiment, sum of the height of each of the first conductive posts 191 and the thickness of the first chip 200 is equal to the height of each of the second conductive posts 192.

In the chip packaging structure 10, the contact area between the first chip 200 and the first packaging substrate 100a is increased because the first solder ball 101 surrounds the entire circumferential surface of the first conductive post 191 and the corresponding first electrode pad 210. The contact area between the first chip packaging body 11 and the second chip packaging body 12 is increased because each of the second solder balls 103 surrounds the entire circumferential surface of the corresponding second conductive post 192 and covers the entire corresponding second contact pad 330. Therefore the first and second solder balls 101, 103 are more reliable even though the chip packaging structure 10 is touched when in transport or in use to make sure the chip packaging structure 10 can work normally and safe.

In other embodiments, the packaging substrate 100b in the second embodiment can be applied in the chip packaging structure 10 instead of the packaging substrate 100a in the first embodiment.

Even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A method for manufacturing a packaging substrate comprising:

providing a circuit board, the circuit board comprising a first base having a first surface and a second surface at opposite sides thereof, a first conductive pattern layer formed on the first surface, a second conductive pattern layer formed on the second surface, a first solder mask formed on part of the first surface which is exposed to the first conductive pattern layer and part of the first conductive pattern layer, a second solder mask formed on part of the second surface which is exposed to the second conductive pattern layer and part of the second conductive pattern layer, the first solder mask defining a plurality of first openings and a plurality of second openings, part of the first conductive pattern layer exposed to the first openings and the second openings, the second solder mask defining a plurality of third openings, and part of the second conductive pattern layer exposed to the third openings;

forming a metal layer on the first solder mask;

forming a first plating barrier pattern on the second solder mask and part of the second conductive pattern exposed to the second solder mask;

forming a first plating layer on the metal layer and the first conductive pattern layer;

forming a second plating barrier pattern on the first plating layer, the second plating barrier pattern defining a plurality of first through holes corresponding to the first openings;

forming a first etching barrier pattern on part of the first plating layer which is exposed to the first through holes;

removing the second plating barrier pattern;

forming a second plating layer on the first plating layer and the first etching barrier pattern;

forming a second etching barrier pattern corresponding to the second openings on the second plating layer;

etching the first plating layer and the second plating layer to form a plurality of first conductive posts in the first openings and a plurality of second conductive posts in the second openings.

2. The method of claim 1, further comprising removing the first plating barrier pattern, the first etching barrier pattern, and the second etching barrier pattern.

3. The method of claim 1, wherein the first etching barrier pattern is formed on part of the first plating layer which is exposed to the first through holes by a plating method.

4. The method of claim 3, wherein the first etching barrier pattern is made of tin or nickel.

5. The method of claim 1, wherein the first etching barrier pattern is molten to form solder caps using an IR-reflow soldering process.

* * * * *